(12) United States Patent
Chiu et al.

(10) Patent No.: US 10,157,902 B2
(45) Date of Patent: Dec. 18, 2018

(54) SEMICONDUCTOR DEVICES WITH CELLS COMPRISING ROUTING RESOURCES

(71) Applicant: Taiwan Semiconductor Manufacturing Company Limited, Hsinchu (TW)

(72) Inventors: Mao-Wei Chiu, Taoyuan (TW); Ting-Wei Chiang, New Taipei (TW); Hui-Zhong Zhuang, Kaohsiung (TW); Li-Chun Tien, Tainan (TW); Chi-Yu Lu, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 118 days.

(21) Appl. No.: 15/366,033

(22) Filed: Dec. 1, 2016

(65) Prior Publication Data
US 2017/0345810 A1 Nov. 30, 2017

Related U.S. Application Data

(60) Provisional application No. 62/343,246, filed on May 31, 2016.

(51) Int. Cl.
*H01L 27/02* (2006.01)
*H01L 29/06* (2006.01)
(Continued)

(52) U.S. Cl.
CPC .... *H01L 27/0207* (2013.01); *H01L 21/32055* (2013.01); *H01L 21/76895* (2013.01); *H01L 27/11807* (2013.01); *H01L 29/0684* (2013.01); *H01L 21/823475* (2013.01); *H01L 2027/11875* (2013.01)

(58) Field of Classification Search
CPC ......... H01L 21/32055; H01L 21/76895; H01L 21/823475; H01L 23/528; H01L 23/53271; H01L 27/0207; H01L 29/0684; H01L 27/092
See application file for complete search history.

(56) References Cited

U.S. PATENT DOCUMENTS

2009/0167394 A1* 7/2009 Bosshart ........ G01R 31/318536
327/203

* cited by examiner

*Primary Examiner* — Bilkis Jahan
*Assistant Examiner* — Victor Barzykin
(74) *Attorney, Agent, or Firm* — Jones Day

(57) ABSTRACT

A cell comprising at least one diffusion region and a plurality of interconnection conductive patterns located over the at least one diffusion layer and comprising a first outer interconnection conductive pattern and a second outer interconnection conductive pattern. The cell further includes at least one different conductive pattern located above the at least one diffusion region and interspersed between the plurality of interconnection conductive patterns. The at least one diffusion region extends in a first direction and the plurality of interconnection conductive patterns and at least one different conductive pattern extend in a second direction substantially perpendicular to the first direction. At least one of the interconnection conductive patterns extends in the second direction substantially perpendicular to the first direction and is long enough to connect to another interconnection conductive pattern on a second cell when the cell abuts the second cell vertically to create at least one routing resource.

20 Claims, 4 Drawing Sheets

(51) Int. Cl.
*H01L 21/768* (2006.01)
*H01L 21/3205* (2006.01)
*H01L 21/8234* (2006.01)
*H01L 27/118* (2006.01)

SEMICONDUCTOR DEVICES WITH CELLS COMPRISING ROUTING RESOURCES

CROSS-REFERENCE TO RELATED APPLICATIONS

This application claims priority to U.S. Provisional Patent Application No. 62/343,246, filed May 31, 2016, entitled "Semiconductor Devices with Engineering Change Order (ECO) Base Comprising Supplemental Routing Resources," which is incorporated herein by reference in its entirety.

TECHNICAL FIELD

This relates to semiconductor devices and more particularly to semiconductor devices with bases comprising routing resources.

BACKGROUND

In integrated circuit design, engineering change order (ECO) is the process of inserting a logic change directly into the integrated circuit after the design of the integrated circuit has already been processed (e.g., after tape-out). Typically, to accommodate such modifications, extra logic may be incorporated into the design of the integrated circuit so the corresponding logic can be added to the design of the integrated circuit if required by an ECO. In some instances, integrated circuit design may involve the use of cells. Cells are structures that have a predefined pattern within the integrated circuit. Since a predetermined library of cells may be stored, this approach to design is beneficial because it is not necessary to design each individual gate within the integrated circuit. Rather, during the physical layout of the integrated circuit, the designer breaks down a new circuit design into a number of known cell designs and then combines these cells appropriately to generate a circuit that performs a desired function.

During the physical layout, cells referred to as bases or ECO bases may be included within the layout. ECO bases are designed without specific logic, but are configurable to provide the desired logic function. Although the inclusion of ECO bases is an improvement over merely incorporating extra logic elements into the integrated circuit layout, both structures can be difficult to interconnect with the remaining portions of the integrated circuit design since there may be significant routing necessary to make needed interconnections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
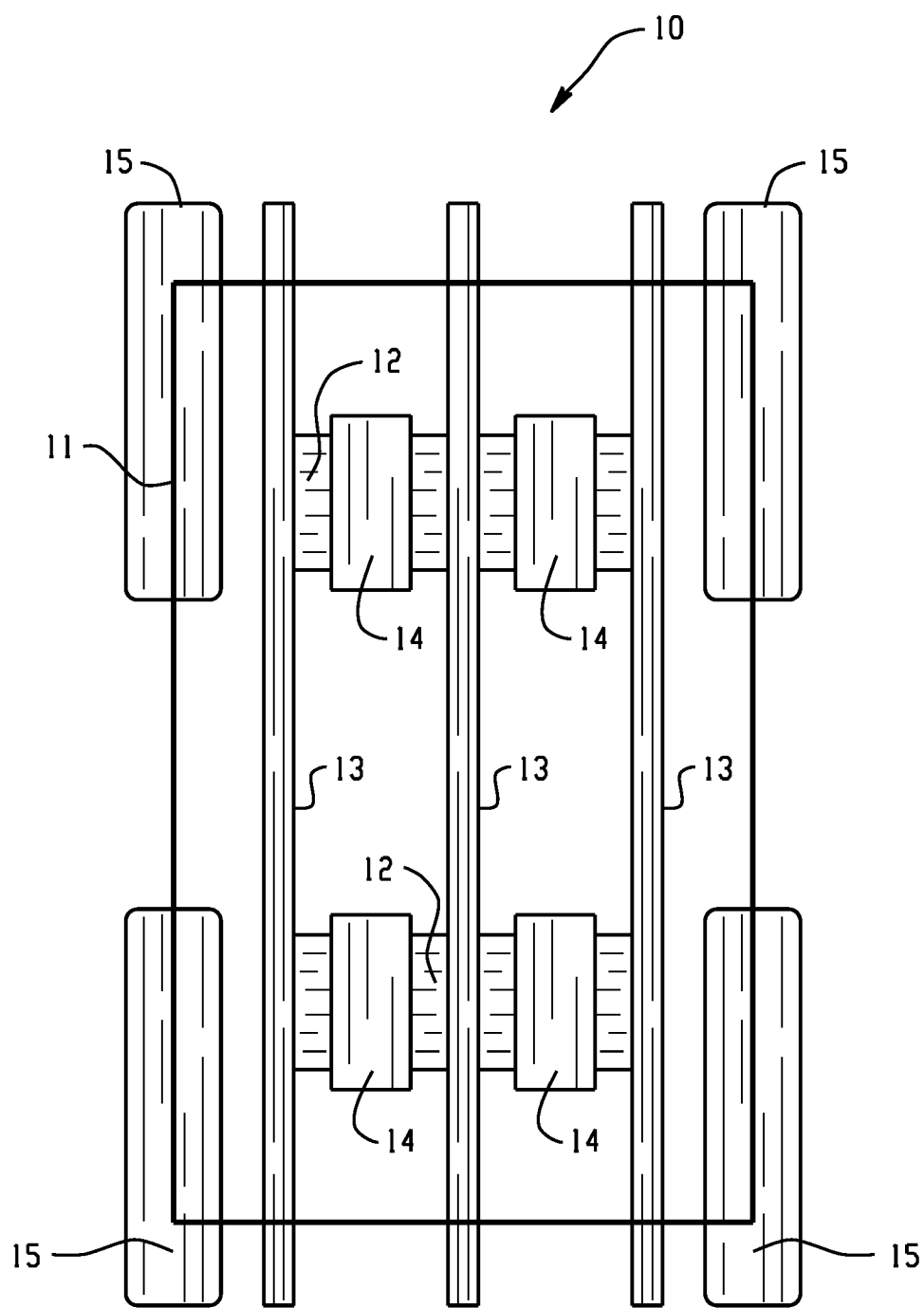
FIG. 1 is a schematic drawing of an example of an ECO base design with routing resources, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments provides semiconductor devices with cell (e.g., bases or ECO base) designs that comprise routing resources that may address one or more disadvantages of existing semiconductor structures. In some embodiments, the routing resources formed, at least in part, by interconnection conductive patterns within the cell (e.g., conductive patterns 14, 15 illustrated in FIG. 2 and FIG. 3) may eliminate and/or reduce the use of upper metal layers (e.g., back-end layers) which may be more difficult to use for forming proper interconnection under the limited area. Additionally, the extra routing may as save routing resources at the cell level so that more routing resources are available at the chip level (ex: APR (Automatic Placement & Routing)). In other words, because routing resources are provided at the cell level, upper metal layers do not need to be reserved for this function. In some embodiments, not having to utilize the upper metal layers reduces complexity of the semiconductor device and saves space within the semiconductor device since routing to the upper metal layers (and back to the cell) is not required.

Figure 2:
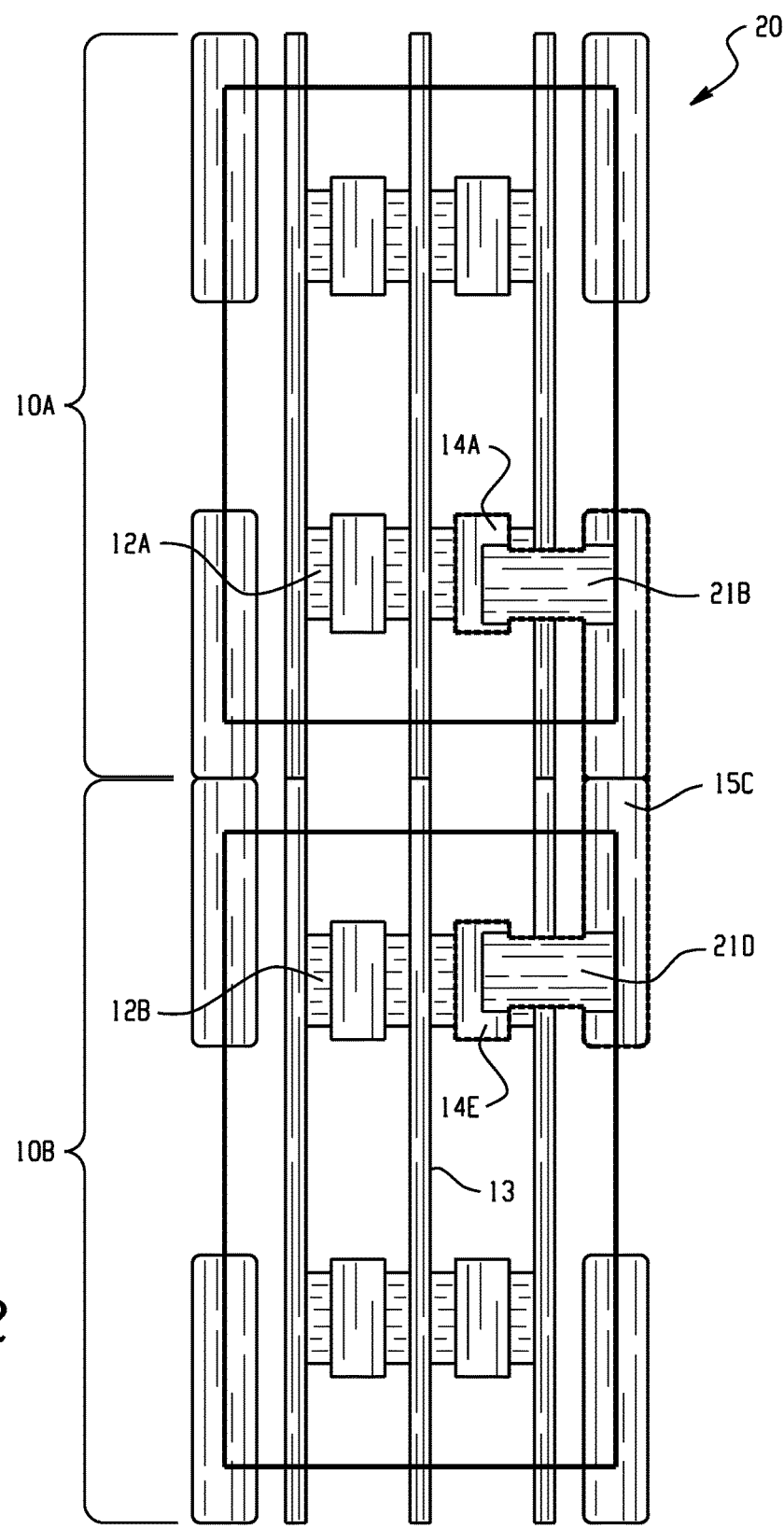
FIG. 2 is a schematic drawing of a first example of a vertical abutment of two ECO bases with routing resources, in accordance with some embodiments.
Figure 3:
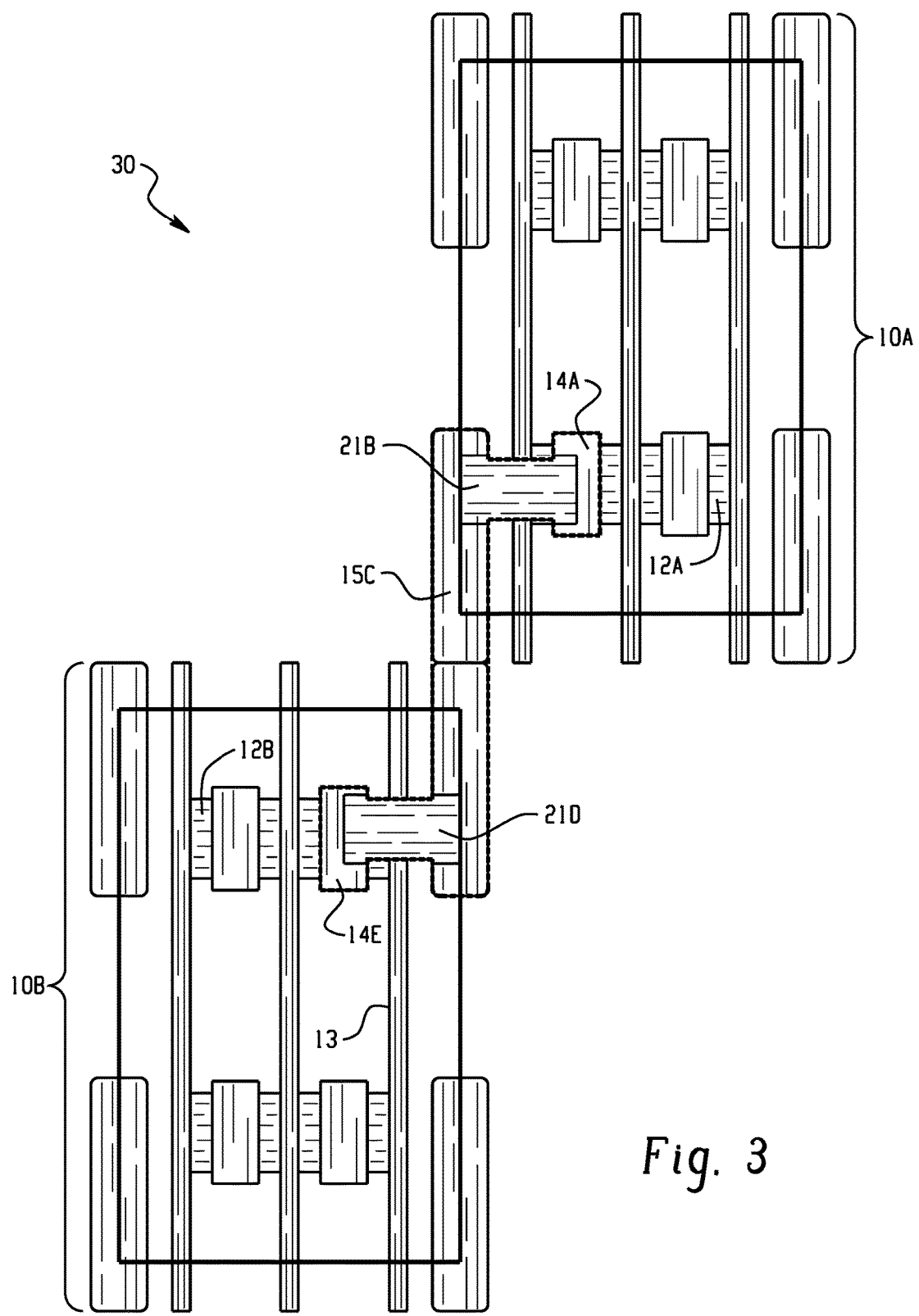
FIG. 3 is a schematic drawing of a second example of a vertical abutment of two ECO bases with routing resources, in accordance with some embodiments.

For example, the disclosure describes novel engineering change order (ECO) base designs that comprise routing resources formed, at least in part, by conductive patterns within the cell (e.g., interconnection conductive patterns 14, 15 illustrated in FIG. 2 and FIG. 3) and, in some embodiments, provides for a novel ECO base design in which the conductive path at one or more corners of the ECO base is a dummy conductive path which can be used for supplemental routing or interconnection.

As described herein, the ECO base is a predetermined cell design that is created as part of the physical layout of the integrated circuit. ECO bases may be located at regular intervals or in otherwise predetermined locations within the physical design of the integrated circuit. ECO bases are not configured to provide a specific functions (i.e., they are not operational in their existing configuration). An ECO mask is a change mask that alters the function of the ECO base to a desired function (e.g., a desired logical function). In other words, the ECO mask can be used to "program" an ECO base to operate and provide one of the same, common, low-level functions provided by a corresponding standard functional cell. In some embodiments, the arrangement of the ECO base may be sufficient so that a given ECO base is able to be "programmed" to operate and provide one of the logic functions including an inverter, NAND, NOR, XOR, D-latch, decoupling capacitor (DeCap), and-or-invert (AOI), or-and-invert (OAI), multiplexer, flip-flop, or the like. Then, the ECO cell can be routed to be operatively connected to one or more standard functional cells and operate as part of the integrated circuit. The ECO cell is the term used to specify at least one ECO base to which a specific ECO shell has been applied (an "ECO shell" may comprise a collection of ECO masks). As used herein, the term cell refers to structures that have a predefined pattern within the integrated circuit. For example, cells may include logical cells with a predetermined function used in the initial layout of a semiconductor device, bases, ECO bases, and/or ECO cells.

FIG. 1 is a schematic drawing of an example of an ECO base design with routing resources. As illustrated in the FIG. 1, the ECO base 10 comprises a boundary 11 and a plurality of diffusion regions (commonly referred to as "OD") 12 located within the boundary 11. The diffusion region may also be referred to as an active region or an oxide diffusion region. As used herein, these terms are used interchangeably. Overlapping the plurality of diffusion regions 12 is one or more first conductive patterns 13 and one or more interconnection conductive patterns 14, 15. In certain embodiments, the first conductive pattern 13 may be a polysilicon pattern and/or a polysilicon gate electrode and may be referred to as "PO" patterns. In certain embodiments, the interconnection conductive patterns 14, 15 may be metal patterns (e.g., metal patterns on the oxide diffusion regions) and may be referred to as "MD" patterns (or "MO on OD patterns"). A conductive pattern 14, 15 may connect to another conductive pattern 14, 15 in the same column inside an ECO Base depending on the design/pattern applied to the ECO Base. In this regard, although the ECO base in FIG. 1 is shown in a particular configuration, in general, the designer may determine how short or how long the conductive patterns 14, 15 may extend so as to build the one or more ECO bases to form an ECO cell. In other words, the one or more first conductive patterns 13 and/or one or more of the interconnection conductive patterns 14, 15 may be formed in a particular pattern to suit a particular need. By forming the first conductive patterns 13 and/or the interconnection conductive patterns 14, 15 in a particular manner the diffusion regions (OD) 12 can effectively be isolated, as shown in FIG. 1. In some embodiments, the interconnection conductive pattern 15 may be formed into two segments.

As illustrated, in certain embodiments, the diffusion regions 12 may extend in a first direction while the plurality of interconnection conductive patterns 14, 15 and the one or more first conductive patterns 13 may extend in a second direction substantially perpendicular to the first direction. In certain embodiments, the first and second direction may be different but not necessarily perpendicular or substantially perpendicular.

Although FIG. 1 illustrates an ECO base with two diffusion regions 12, it is possible that the ECO base has fewer (e.g., 1) or more than two diffusion regions 12. For example, the ECO base may comprise 2, 3, 4, 5, or 6 diffusion regions 12. In general, the diffusion region is the region in which a particular MOS transistor may be formed. For example, depending on the particular doping of layers below the diffusion region 12, a PMOS or NMOS transistor may be formed in some or all of the diffusion regions 12. The necessary information to create these structures from an ECO base may be defined in the ECO shell or ECO mask discussed above.

As illustrated in FIG. 1, the interconnection conductive patterns 14, 15 do not extend into the center of the ECO base. However, above and below the diffusion regions 12, the interconnection conductive patterns 15 extend further past the diffusion region than the interconnection conductive patterns 14. As a result, in the example shown in FIG. 1, four (4) interconnection conductive patterns 15 are formed that extend past the diffusion region 12 and in the case of FIG. 1, past the boundary 11. In the example shown in FIG. 1, these conductive patterns 15 are located at the corners of the ECO base 10 and may be referred to as dummy patterns (or "dummy MDs") since they are not utilized as part of the active regions. As will be described in more detail below, since the interconnection conductive patterns 15 in one ECO base are more accessible (e.g., they extend past the diffusion region 12) to interconnection conductive patterns 15 of an adjacent ECO base they form at least part of the routing resources that electrically couple the ECO bases together and are characteristic of the ECO base design described herein.

In certain embodiments, the interconnection conductive patterns 15 may be located at certain corners of the ECO base 10 and in other embodiments the interconnection conductive patterns 15 may be located at all four corners of the ECO base 10. In certain embodiments, the ECO base design may include 1, 2, 3, or 4 interconnection conductive patterns 15.

In the particular embodiment of the ECO base illustrated in FIG. 1, the ECO base 10 may comprise two diffusion regions 12 and a plurality of interconnection conductive patterns 14, 15 located over the two diffusion layers. The plurality of interconnection conductive patterns comprises at least a first outer interconnection conductive pattern 15, a second outer interconnection conductive pattern 15, and at least two inner interconnection conductive patterns 14. The ECO base 10 also comprises a plurality (e.g., three) of first conductive patterns 13 located above the two diffusion regions 12 and interspersed between the plurality of interconnection conductive patterns 14, 15. As illustrated in FIG. 1 the three first conductive patterns 13 are positioned in an alternating fashion with the interconnection conductive patterns 14, 15 such that interconnection conductive patterns 15 are located at the outer most positions. As further illustrated in FIG. 1, the outer interconnection conductive patterns 15 extend further than the inner interconnection conductive patterns 14 in a direction above and below the diffusion region. In some embodiments, the outer interconnection conductive patterns 15 may extend outward such that they are the outermost feature of the ECO base. As will be described below, this characteristic of the interconnection conductive patterns 15 may assist with the creation of ECO cells.

Furthermore, the diffusion regions 12, may extend in a first horizontal direction and the plurality of interconnection conductive patterns 14, 15 and the plurality of first conductive patterns 13 may each extend in a second vertical direction substantially perpendicular to the first direction. In this structure, since outer interconnection conductive patterns 15 are positioned at each of the outer corners of the ECO base 10, they may be used to form a routing resource at each corner of the ECO base 10.

FIG. 2 is a schematic drawing of a first example of a vertical abutment of two ECO bases in which outer interconnection conductive patterns are utilized to form routing resources. Although the example in FIG. 2 illustrates vertical abutment, it should be well understood that the ECO based could be rotated by 90 degrees in which case the ECO bases would be horizontally abutted. In general, the embodiment could be abutted in any manner as long as the orientation of the ECO bases is the same or substantially similar. As shown in FIG. 2, the ECO base 10A comprises at least one diffusion region 12A and ECO base 10B comprises at least one diffusion region 12B. As discussed above, depending on the ECO shell, a particular type of MOS device may be formed in each diffusion region (OD) 12A, 12B. For example, a PMOS or NMOS device may be formed in the diffusion region 12A and/or 12B.

Figure 4:
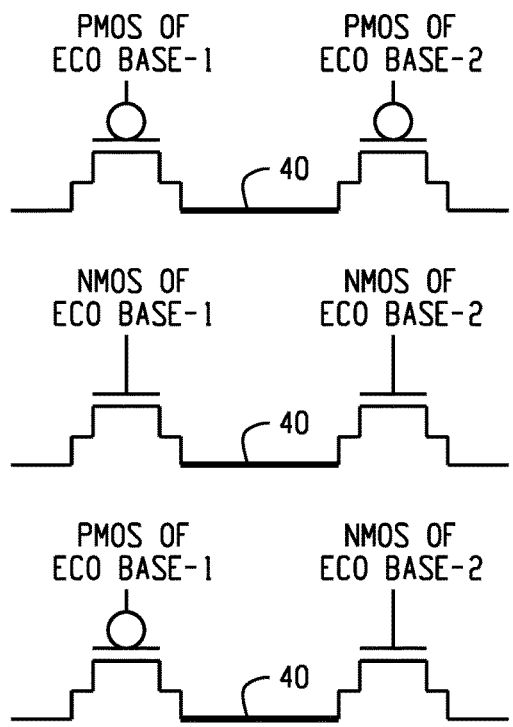
FIG. 4 is a schematic drawing of several examples of connections that may be achieved using the ECO bases described herein, in accordance with some embodiments.

In some embodiments, the ECO cell may add additional logic into the integrated circuit and/or correct an error in existing logic in the integrated circuit. Therefore, in some situations, it may be desirable to connect one MOS device in one ECO base to another MOS device in another ECO base to form a desired ECO cell. Some of these types of connections are illustrated in FIG. 4 which is a schematic drawing of exemplary connections between MOS devices. As illustrated in FIG. 4, one PMOS device may be connected to another PMOS device. Alternatively, one NMOS device may be connected to another NMOS device or one PMOS device may be connected to another NMOS device. Any number of configurations may be possible and/or desirable. In each of the configurations shown in FIG. 4, the source and/or drain of one device may be connected to the source and/or drain of another device by connection 40.

Referring again to FIG. 2, the connection 40 can be achieved using the ECO base design described herein. In particular, the connection 40 shown in FIG. 4 is achieved using the combination of 14A, 21B, 15C, 21D, and 14E as illustrated in FIG. 2. As can be seen from FIG. 2, it was not necessary to utilize any additional routing (e.g., routing in the upper metal layers of the device) to achieve this connection. As shown, interconnection conductive pattern 14A may be electrically coupled to the diffusion layer 12A using various methods for forming a silicon layer of the oxide diffusion region. For example, the interconnection conductive pattern may be the conductive contact corresponding to the source and/or drain of a MOS device. The interconnection conductive pattern 14A may be further connected to the interconnection conductive pattern 15C by way of bridge 21B (also referred to as an "MP" region or "M0 on Poly patterns"). In some embodiments, the "MP" region may be an abutting layer which connects the two conductive patterns (MD) 14A and 15C and one first conductive (e.g., polysilicon) pattern 13 together. In some embodiments, the MP region 21B, 21D may be formed as a layer above the conductive patterns 14A, 14E, 15C and the first conductive pattern 13. In some embodiments, one or more vias may be used to connect the bridge 21B to the layers 13, 14A, and/or 15C. Interconnection conductive pattern 15C may be connected to interconnection conductive pattern 14E by way of bridge 21D. In some embodiments, the regions 12 and 13 may be manufactured during an early front end of line (FOEL) process and regions 14, 15, and 21 may be manufactured in a later, middle end of line (MEOL) process. As illustrated in FIG. 2, this connection between diffusion regions 12A and 12B via 14A, 21B, 15C, 21D, and 14E, sequentially, is possible because the conductive pattern (MD) 15C (formed by joining two conductive patterns 15 from ECO Base 10A and 10B) can provide a connection between the two ECO bases 10A and 10B. For example, since the outer interconnection conductive regions 15 extend further than interconnection regions 14 and diffusion layer 12, a conductive path can be formed between diffusion regions 12A, 12B without interruption. In some embodiments, the layers may be formed by stacking the various layers on top of one another as illustrated in FIG. 2. For example, interconnection conductive patterns 14A, 14E, and 15 C may be formed as a layer above the diffusion regions 12A and 12B and bridges 21B and 21D may be formed on a layer above the interconnection conductive patterns. In this manner the various layers may be connected to one another and bridges 21B and 21D can be used to transmit signals between the ECO bases.

FIG. 3 is a schematic drawing of a second example of a vertical abutment of two ECO bases in which outer interconnection conductive patterns are utilized to form routing resources. As illustrated, FIG. 3 exemplifies a situation when the two ECO cells are not vertically aligned. As discussed above in connection with FIG. 2, although FIG. 3 also illustrates vertical abutment (without vertical alignment), it should be well understood that the ECO based could be rotated by 90 degrees in which case the ECO bases would be horizontally abutted. In general, the embodiment could be abutted in any manner as long as the orientation of the ECO bases is the same or substantially similar. The connection between diffusion layer 12A and diffusion layer 12B (e.g., connection 40) is achieved by the combination of elements 14A, 21B, 15C, 21D, and 14E. Although FIG. 2 and FIG. 3 both illustrate the vertical connection of 2 ECO bases 10A, 10B, the design of the ECO base described herein does not alter the ability of the ECO base to be connected (vertically) to another ECO base within an ECO cell. In certain embodiments, bridges similar to the bridges 21B, 21D may be used.

In some embodiments, the orientation of the ECO bases may not be the same. For example, as long as a routing resource could be formed in a manner as described above with respect to FIG. 2 and FIG. 3, the orientation of the ECO base may be varied.

Figure 5:
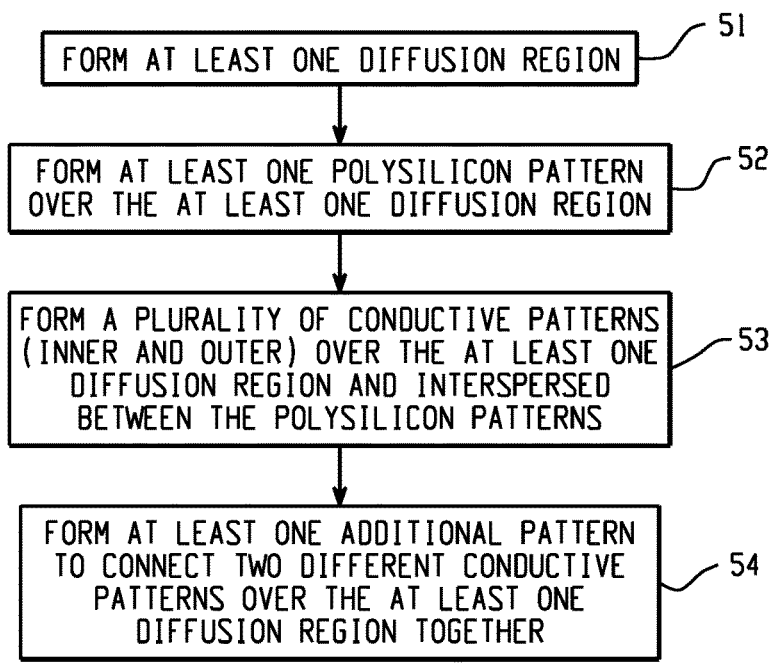
FIG. 5 is a flow chart of an example of a method that may be implemented to manufacture a semiconductor device such as the examples of the ECO bases described herein, in accordance with some embodiments.

FIG. 5 is a flow chart of an example of a method that may be implemented to manufacture a semiconductor device such as the examples of the ECO bases described herein. As illustrated, the method may comprise forming at least one diffusion region 12 (e.g., an oxide diffusion layer), in operation 51, and then forming at least one polysilicon pattern 13 over the at least one diffusion layer 12, in operation 52. In addition to the polysilicon patterns 13, the method further includes forming a plurality of conductive patterns 14, 15 above the at least one diffusion region 12 and interspersed between the at least one polysilicon pattern 13, in operation 53. In operation 54, at least one bridge 21 is formed to connect two different conductive patterns over the at least one diffusion region 12 together. In operation 53, the plurality of conductive patterns 14, 15 may comprise at least one outer interconnection conductive pattern 15 formed over the at least one diffusion region such that the at least one outer interconnection conductive pattern 15 creates at least one routing resource when it is coupled to an outer interconnection conductive pattern 15 of another ECO base. In some embodiments, operation 53 may comprise forming conductive patterns 14, 15 at the same time and interspersing the conductive patterns 14, 15 between the plurality of patterns 13. The length of patterns 14 and 15 may be different which may be based on the needs of the interconnection. In some embodiments, conductive pattern 14 may be an inner conductive pattern for the diffusion region 12 and pattern 15 may be an outer conductive pattern on the outer edge of the diffusion region 12. In some embodiments, a first outer interconnection conductive pattern 15 in a first ECO base 10A and the second outer interconnection conductive pattern 15 in a second ECO base 10B may be aligned and may extend in a second direction substantially perpendicular to the first direction and be long enough to connect to each other when the ECO bases abut one another vertically. This electrical connection creates the at least one routing resource.

Embodiments described herein may provide a cell for a semiconductor device (e.g., an engineering change order (ECO) base), comprising at least one diffusion region, a plurality of interconnection conductive patterns located over the at least one diffusion region and comprising at least a first outer interconnection conductive pattern and a second outer interconnection conductive pattern, and at least one different conductive (e.g., polysilicon) pattern located above the at least one diffusion region (e.g., an oxide diffusion region) and interspersed between the plurality of interconnection conductive patterns. The outer interconnection conductive patterns may extend further than the inner interconnection conductive patterns 14 in a direction above and/or below the at least one diffusion region. In some embodiments, the outer interconnection conductive patterns 15 may extend outward such that they are the outermost feature of the ECO base. In some embodiments, a first outer interconnection conductive pattern on a first ECO base and a second outer interconnection conductive pattern on a second ECO base may be aligned and long enough to connect with each other when the ECO bases abut one another, thereby creating at least one routing resource.

Embodiments described herein may provide an engineering change order (ECO) base, comprising at least two diffusion regions; a plurality of interconnection conductive patterns located over the at least two diffusion layers and comprising at least a first outer interconnection conductive pattern, a second outer interconnection conductive pattern, and at least two inner interconnection conductive patterns; and a plurality of polysilicon patterns located above the at least two diffusion regions and interspersed between the plurality of interconnection conductive patterns. The plurality of interconnection conductive patterns and portions of the plurality of polysilicon pattern may be patterned such that the interconnection conductive patterns do not extend into the center of the ECO base but, above and below the diffusion regions, the interconnection conductive patterns 15 extend further past the diffusion region than the interconnection conductive patterns 14 toward the outer corners of the ECO base. The at least two diffusion regions may extend in a first direction and the plurality of interconnection conductive patterns and the plurality of polysilicon patterns may extend in a second direction substantially perpendicular to the first direction. A first outer interconnection conductive pattern on a first ECO base and a second outer interconnection conductive pattern on a second ECO base may be aligned and long enough to connect with each other when the ECO bases abut one another so as to create at least one routing resource.

In certain embodiments, routing resources may be created at each corner of the ECO base. In certain embodiments, the at least one routing resource may enable vertical abutment between at least two ECO bases for an ECO cell. In certain embodiments, the at least one diffusion region (e.g., oxide diffusion region) may comprise at least 2 diffusion regions or at least 3 diffusion regions. In certain embodiments, the plurality of interconnection conductive regions may comprise at least 4 interconnection conductive patterns. In certain embodiments, the at least one routing resource may comprise at least 2 routing resources or 4 routing resources.

In some embodiments, the ECO cells described herein may be formed from ECO cell layout. In certain embodiments, the ECO cell layout may comprise the structures described herein and/or be a set of instructions for forming the various structures described herein. In certain embodiments, the instructions may be a program stored in a non-transitory computer readable recording medium. Some examples of a non-transitory computer readable recording medium include, but are not limited to, external/removable and/or internal/built-in storage or memory units, e.g., one or more of an optical disk, such as a DVD, a magnetic disk, such as a hard disk, a semiconductor memory, such as a ROM, a RAM, a memory card, and the like.

The components and procedures described above provide examples of elements recited in the claims. They also provide examples of how a person of ordinary skill in the art can make and use the claimed invention. They are described here to provide enablement and best mode without imposing limitations that are not recited in the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A cell for a semiconductor device, comprising:
   at least one diffusion region;
   a plurality of interconnection conductive patterns located over the at least one diffusion region and comprising at least a first outer interconnection conductive pattern and a second outer interconnection conductive pattern; and
   at least one different conductive pattern located above the at least one diffusion region and interspersed between the plurality of interconnection conductive patterns;
   wherein the at least one diffusion region extends in a first direction and the plurality of interconnection conductive patterns and at least one different conductive pattern extends in a second direction substantially perpendicular to the first direction; and
   wherein at least one of the interconnection conductive patterns extends in the second direction substantially perpendicular to the first direction and is long enough to connect to another interconnection conductive pattern on a second cell when the cell abuts the second cell to create at least one routing resource;
   wherein the cell is an engineering change order (ECO) base.

2. The cell for a semiconductor device of claim 1, wherein the first outer interconnection conductive pattern and the second outer interconnection conductive pattern extend in the second direction substantially perpendicular to the first direction and are both long enough to connect to another corresponding outer interconnection conductive pattern on a second cell when the cell abuts the second cell to create at least one routing resource.

3. The cell for a semiconductor device of claim 1, wherein the at least one different conductive pattern is a polysilicon pattern.

4. The cell for a semiconductor device of claim 1, wherein routing resources can be created at each corner of the base.

5. The cell for a semiconductor device of claim 1, wherein the at least one routing resource enables abutment between at least two bases.

6. The cell for a semiconductor device of claim 1, wherein the at least one diffusion region comprises at least 2 diffusion regions.

7. The cell for a semiconductor device of claim 1, wherein the plurality of interconnection conductive patterns comprises at least 4 interconnection conductive patterns.

8. The cell for a semiconductor device of claim 1, wherein the at least one routing resource comprises at least 2 routing resources.

9. A method for manufacturing a cell for a semiconductor device, the method comprising:
    forming at least one diffusion region;
    forming at least one conductive pattern located above the at least one diffusion region; and
    forming a plurality of inner interconnection conductive patterns over the at least one diffusion region and interspersed between the at least one conductive pattern;
    forming at least one outer interconnection conductive pattern over the at least one diffusion layer, the at least one outer interconnection conductive pattern being longer than and extending further outwardly than the plurality of inner interconnection conductive patterns; a
    wherein at least one of the outer interconnection conductive patterns is long enough to connect to another outer interconnection conductive pattern on a second cell when the cell abuts the second cell to create at least one routing resource;
    wherein the cell is an engineering change order (ECO) base.

10. The method of claim 9, wherein the cell comprises at least two outer interconnection conductive patterns and that are long enough to connect to another corresponding outer interconnection conductive pattern on a second cell when the cell abuts the second cell to create at least one routing resource.

11. The method of claim 9, wherein the inner interconnection conductive patterns is a polysilicon pattern.

12. The method of claim 9, wherein the at least one routing resource is located at each corner of the ECO base.

13. The method of claim 9, wherein the at least one routing resource enables abutment between at least two bases.

14. The method of claim 9, wherein the at least one diffusion region comprises at least 2 diffusion regions.

15. The method of claim 9, wherein the plurality of interconnection conductive patterns comprises at least 4 interconnection conductive patterns.

16. The method of claim 9, wherein the at least one routing resource comprises at least 2 routing resources.

17. An engineering change order (ECO) base, comprising:
    at least two diffusion regions;
    a plurality of interconnection conductive patterns located over the at least two diffusion regions and comprising at least a first outer interconnection conductive pattern, a second outer interconnection conductive pattern, and at least two inner interconnection conductive patterns;
    a plurality of polysilicon patterns located above the at least two diffusion regions and interspersed between the plurality of interconnection conductive patterns;
    wherein the plurality of interconnection conductive patterns and the plurality of polysilicon patterns may be patterned such that the interconnection conductive patterns do not extend into the center of the cell between the at least two diffusion regions but, above and below the at least two diffusion regions, the first outer interconnection conductive pattern and the second outer interconnection conductive pattern extend further outwardly past the diffusion region than the at least two inner interconnection conductive patterns;
    wherein the at least two diffusion regions extend in a first direction and the plurality of interconnection conductive patterns and the plurality of polysilicon patterns extend in a second direction substantially perpendicular to the first direction; and
    wherein at least one of the first outer interconnection conductive pattern and the second outer interconnection conductive pattern is aligned and long enough to connect with another interconnection conductive pattern from a second cell when the cell abuts the second cell so as to create at least one routing resource.

18. The ECO base of claim 17, wherein the supplemental routing resources enable abutment between at least two bases.

19. The ECO base of claim 17, wherein the at least one routing resource is located at each corner of the ECO base.

20. The ECO base of claim 17, wherein the at least one routing resource comprises at least 2 routing resources.

* * * * *